United States Patent
Dietrich et al.

(10) Patent No.: US 7,363,561 B2
(45) Date of Patent: Apr. 22, 2008

(54) METHOD AND CIRCUIT ARRANGEMENT FOR RESETTING AN INTEGRATED CIRCUIT

(75) Inventors: Stefan Dietrich, Türkenfeld (DE); Thomas Hein, München (DE); Patrick Heyne, München (DE); Peter Schrögmeier, München (DE)

(73) Assignee: Infineon Technologies AG, Munich (DE)

( * ) Notice: Subject to any disclaimer, the term of this patent is extended or adjusted under 35 U.S.C. 154(b) by 260 days.

(21) Appl. No.: 11/117,736

(22) Filed: Apr. 29, 2005

(65) Prior Publication Data

US 2005/0253638 A1    Nov. 17, 2005

(30) Foreign Application Priority Data

Apr. 30, 2004    (DE) .................. 10 2004 021 398

(51) Int. Cl.
*G01R 31/28* (2006.01)
(52) U.S. Cl. ..................................... 714/731
(58) Field of Classification Search ............... 714/34, 714/731
See application file for complete search history.

(56) References Cited

U.S. PATENT DOCUMENTS 4,027,335 A * 5/1977 Miller .................. 360/40
5,619,643 A    4/1997 Moroni et al.

FOREIGN PATENT DOCUMENTS

DE    101 50 418 A1    4/2003
JP    08023478 A  *  1/1996

OTHER PUBLICATIONS

IBM TDB NNRD415115 "High Performance Multistage Pass Gates" Nov. 1998, UK vol. 41 Issue No. 415 Publication-Date: Nov. 1, 1998.*

* cited by examiner

*Primary Examiner*—Cynthia Britt
(74) *Attorney, Agent, or Firm*—Eschweiler & Associates, LLC

(57) ABSTRACT

The invention relates to a method for resetting at least one circuit part of an integrated circuit, in particular a synchronous semiconductor memory, in which a clock signal and a clock signal that is inverted with respect to the latter are provided in order to clock the integrated circuit, and in which, when a reset condition is present, an item of reset information is coded onto the clock signal or onto the inverted clock signal. The invention also relates to a circuit arrangement for carrying out the method according to the invention, having a clock suppression device and a decoder circuit, which is intended to extract the reset information from the clock signal or from the inverted clock signal.

14 Claims, 2 Drawing Sheets

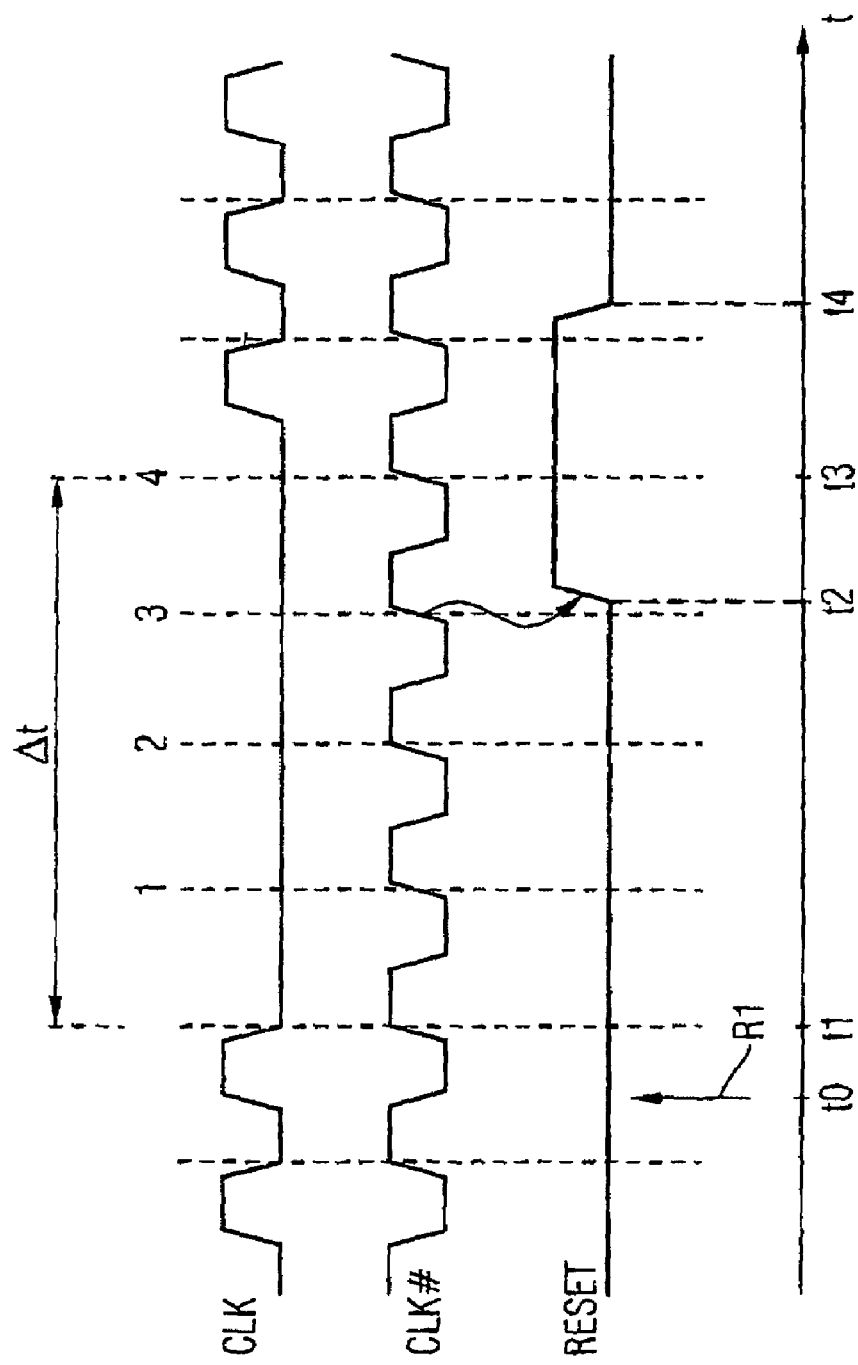

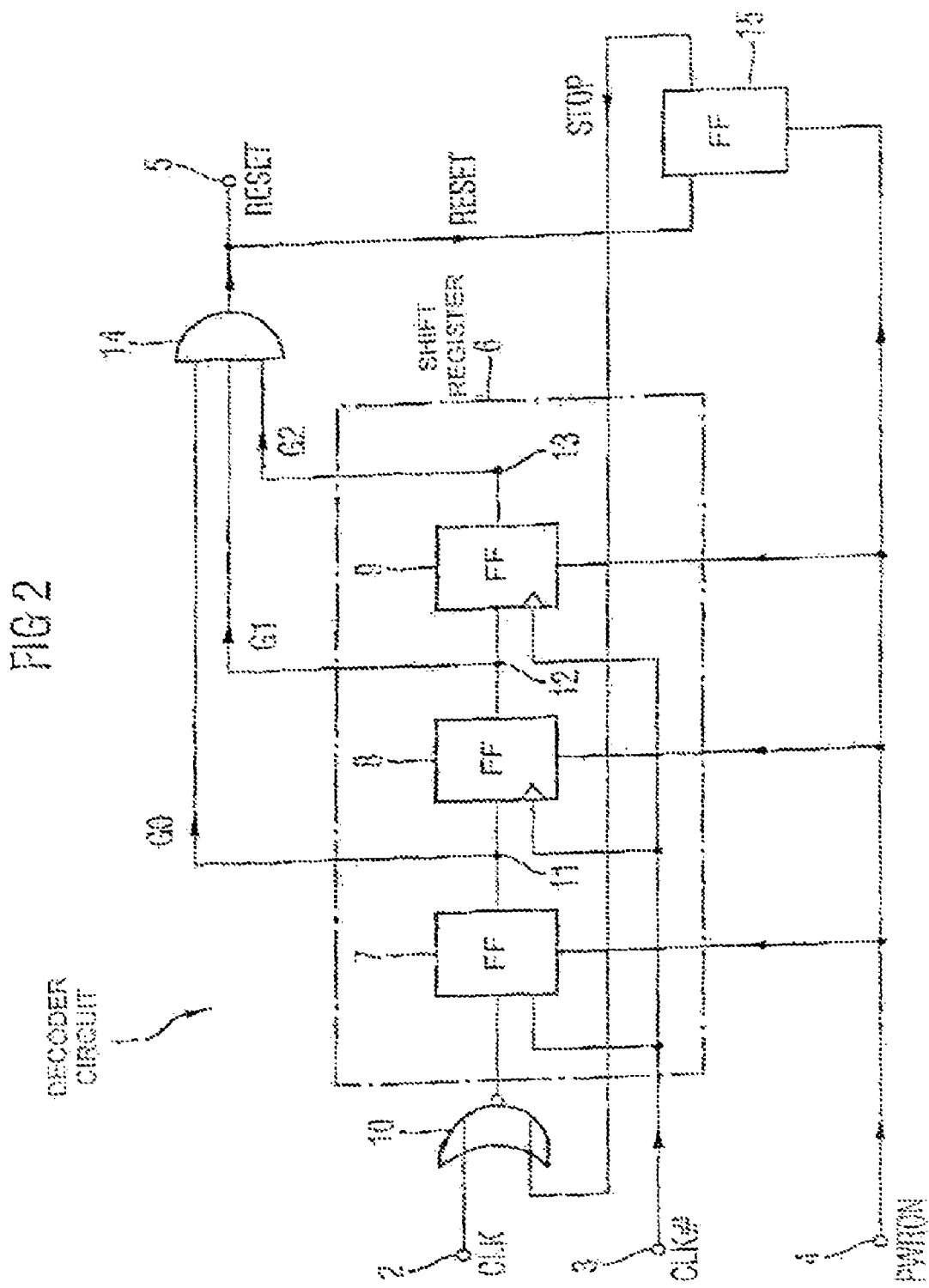

METHOD AND CIRCUIT ARRANGEMENT FOR RESETTING AN INTEGRATED CIRCUIT

CLAIM FOR PRIORITY

This application claims the benefit of priority to German Application No. 10 2004 021 398.4, filed Apr. 30, 2004, the contents of which are hereby incorporated by reference in its entirety.

TECHNICAL FIELD OF THE INVENTION

The invention relates to a method and a circuit arrangement for resetting at least one circuit part of an integrated circuit, in particular a synchronous semiconductor memory.

BACKGROUND OF THE INVENTION

During the initialization of an integrated circuit and in certain states during the operation of this integrated circuit, it is necessary, from time to time, to bring this integrated circuit into a defined state. In digital technology, this defined state of a digital module is brought to a low logic level by means of resetting (RESET or CLEAR) or is also brought to a high logic level, for example, by means of setting (SET). In general, an integrated circuit and the relevant modules of the integrated circuit are brought to a defined level by means of resetting—referred to below as RESET.

For such resetting, the integrated circuit typically has a RESET terminal, which is provided specifically for this purpose and to which the RESET signal is applied. The RESET signals which carry the information for the individual RESET conditions are routed, via connecting lines, to the respective circuit parts—which are to be reset by means of the RESET—of the integrated circuit.

This requires a plurality of RESET connecting lines which are respectively intended to bring the RESET and the corresponding RESET information to the various circuit parts. Whereas connecting lines required specifically for the various RESET signals can still be implemented effectively in simple integrated circuits, this uses a very large amount of space in large scale integrated circuits such as modern DRAM memory modules. In this case, the connecting lines for the RESET signals must be routed to all of the semiconductor modules such as, for example, row decoders, column decoders, input buffers, output buffers, drivers, modulators, demodulators etc. Taking into account the relevant design rules, the provision of the corresponding RESET lines thus uses an extremely large amount of chip area and is thus cost-intensive. However, one requirement when developing and providing large scale integrated circuits is always to provide the integrated circuit in such a manner that, as far as possible, it uses a small amount of area whilst the functionality remains the same.

SUMMARY OF THE INVENTION

The invention relates to a method and a circuit arrangement for resetting at least one circuit part of an integrated circuit, in particular a synchronous semiconductor memory.

The invention relates, in general, to integrated circuits having a plurality of semiconductor modules which are supplied by means of a common clock signal. Although applicable to any desired semiconductor components and integrated circuits, the present invention and the problems on which it is based will be explained below with regard to semiconductor memory devices.

Against this background, the present invention is based on the object of reducing the chip area of an integrated circuit as much as possible.

Accordingly, various embodiments of the invention, there are:

A method for resetting at least one circuit part of an integrated circuit, in particular a synchronous semiconductor memory, in which a clock signal and a clock signal that is inverted with respect to the latter are provided in order to clock the integrated circuit, and in which, when a reset condition is present, an item of reset information is coded onto the clock signal or onto the inverted clock signal.

A circuit arrangement for carrying out the method according to the invention, having a first clock input, into which a clock signal can be injected, having a second clock input, into which a clock signal that is inverted with respect to the clock signal can be injected, having a clock suppression device, which, when a reset condition is present, suppresses the clock of the clock signal or of the inverted clock signal for a prescribed first duration in order to provide an item of reset information, having a decoder circuit, which is intended to extract the reset information from the clock signal or from the inverted clock signal, measures the duration within which the clock of the clock signal or of the inverted clock signal is suppressed and generates a reset signal if the duration measured exceeds the prescribed first duration, and having an output terminal for outputting the reset signal that has been generated.

In another embodiment of the ivention, in the case of integrated circuits of synchronous design, as are constructed, for example, using CMOS technology, a clock signal and a clock signal that is inverted with respect to the latter are needed to synchronize the various circuit parts of the integrated circuit. Such clock signals are binary electrical signals which alternately have a high voltage level (HIGH, logic 1) and a low voltage level (LOW, logic 0) at intervals which are as identical as possible, it being possible for the shape of the individual clock signals to be of rectangular or else trapezoidal form. A clock signal that is inverted with respect to the clock signal has a low logic level in that place in which the clock signal has a high logic level and vice versa. The clock signal and the clock signal that is inverted with respect to the latter are typically generated in the integrated circuit itself or are externally injected.

In the present invention, if there is a RESET condition, this RESET information is now coded, in a suitable manner, onto one of the two clock signals, that is to say onto either the clock signal itself or the clock signal that is inverted with respect to the latter.

A clock signal that is present anyway and is transmitted via clock lines which are present anyway can now advantageously be used to convey the RESET information. This does not require the use of any additional area and thus does not involve any additional costs either. In this case, it is merely necessary to provide a decoder circuit (which is needed to obtain the RESET condition) for the circuit(s) of the integrated circuit which is/are to be reset. However, this can be realized in a very simple manner in terms of circuitry, so that this does not result in the use of a chip area that is too large.

Within a circuit, to which the RESET information is to be supplied and which is thus to be reset, this RESET information that has been coded onto one of the clock signals is now extracted locally. To this end, the circuit or circuits has/have a respective locally available decoder circuit, which uses decoding to extract the RESET information that has been coded onto the respective clock signal. On the output side, this decoder circuit generates a RESET signal for the purpose of resetting the relevant circuit(s). As a result of the fact that the RESET condition and the corresponding RESET signals now no longer have to be externally routed, via RESET connecting lines provided specifically for this purpose, to the circuit(s) to be reset, it is possible to dispense with just these RESET connecting lines. The particular advantage of the present invention is thus, in particular, that it is possible to fabricate the integrated circuits in a more area-saving and thus more cost-effective manner as a result of dispensing with such connecting lines. This results in a significant saving in chip area, in particular in very highly complex integrated circuits.

In an advantageous embodiment, the reset information is coded by suppressing the clock of the clock signal or of the inverted clock signal for a prescribed duration. The prescribed first duration advantageously corresponds at least to the duration of two clock pulses of the clock signal or of the inverted clock signal.

In an advantageous embodiment, the reset information in the clock signal or in the inverted clock signal is locally extracted by a decoder circuit within the integrated circuit by determining the prescribed first duration.

In an advantageous refinement, the prescribed first duration is determined by counting the clock pulses of that clock signal in which the clock pulses have not been suppressed.

In an advantageous embodiment, when the prescribed first duration is exceeded, a decoder circuit within the integrated circuit generates a local reset signal that is used to reset the at least one circuit part.

In this case, the local reset signal is typically generated by changing a signal amplitude from a first logic level to a second logic level for a prescribed second duration.

In an advantageous embodiment, the prescribed second duration corresponds at least to the duration of one clock pulse of the clock signal or of the inverted clock signal.

In an advantageous embodiment, after the prescribed first duration, that clock signal in which the clock was suppressed begins to clock again at a time that is within the prescribed second duration or is after the prescribed second duration.

In an advantageous embodiment, the decoder circuit has a counter for counting the clock pulses of the clock signal or of the inverted clock signal.

In another advantageous embodiment, the decoder circuit has a shift register, which is triggered by the clock of the clock signal whose clock has not been suppressed. In this case, the shift register has a first number of flip-flops, the first number corresponding to the number of clock pulses of the clock signal or of the inverted clock signal which together are needed at least to determine the prescribed first duration.

In an advantageous embodiment, provision is made of a maintenance circuit, which, when the reset signal is present, maintains this reset signal for a prescribed second duration. This maintenance circuit is in the form of a flip-flop, for example.

BRIEF DESCRIPTION OF THE DRAWINGS

The invention will be explained in more detail below with reference to the exemplary embodiments which are indicated in the figures of the drawing. In this case:

FIG. 1 shows a signal/time graph for illustrating the manner in which the RESET information is determined (according to the invention) from a clock signal.

FIG. 2 shows a decoder circuit according to the invention for obtaining the RESET information from a clock signal.

In the figures of the drawing, unless specified otherwise, identical or functionally identical elements and signals have been provided with the same reference symbols.

DETAILED DESCRIPTION OF THE INVENTION

In FIG. 1, CLK is used to designate the clock signal and CLK#is used to designate the clock signal that is inverted with respect to the clock signal. These clock signals CLK, CLK#can be generated, for example, by a DLL (Delay Locked Loop) circuit. The clock signals CLK, CLK#have trapezoidal clock pulses and pulse intervals. A RESET signal is also provided. The RESET signal includes an item of RESET information that is derived, according to the invention, from the two clock signals CLK, CLK#, as will also be described in detail below.

In FIG. 1, CLK is used to designate the clock signal and CLK# is used to designate the clock signal that is inverted with respect to the clock signal. These clock signals CLK, CLK# can be generated, for example, by a DLL (Delay Locked Loop) circuit. The clock signals CLK, CLK# have trapezoidal clock pulses and pulse intervals. A RESET signal RESET is also provided. The RESET signal RESET includes an item of RESET information that is derived, according to the invention, from the two clock signals CLK, CLK#, as will also be described in detail below.

In the period of time that is designated using reference symbol Δt, the clock pulses of the clock signal CLK are suppressed. In the present case, the period of time Δt covers the duration of exactly four complete clock pulses of the clock signal CLK. In this period of time Δt, the inverted clock signal CLK# is unchanged, that is to say it has unchanged clock pulses.

The method according to the invention for obtaining the RESET information and thus the RESET signal RESET will be described in detail below.

At the time t0, a RESET condition R1 is output. The RESET condition R1 means that one or more circuits of the integrated circuit are to be reset. If such a RESET condition R1, which denotes, for example, an initialization phase, a change in the operating frequency, the departure from the self-clocked refresh etc., is detected, the generation of the clock pulses of the clock signal CLK is suppressed or stopped for a prescribed duration Δt, beginning from a subsequent time t1. However, the clock signal CLK# that is inverted with respect to the clock signal CLK remains unaffected, with the result that the inverted clock signal CLK# continues to constantly have clock pulses.

The RESET information is obtained from the clock signal CLK in a very simple manner by counting the clock pulses of the inverted clock signal CLK# during the period of time Δt. To this end, the counter reading of a counter is first of all reset once at a time t0.

The number of clock pulses of a clock signal CLK, CLK#is referred to as the latency. In order to determine the number of these clock pulses, provision is made of a synchronous counter, which counts with the aid of a clock signal that is generated by the DLL circuit. This synchronous counter is also referred to as a latency counter. The decoder circuit according to the invention, which is connected to this latency counter or is part of the latency counter, continuously checks the state of the clock signal CLK and of the inverted clock signal CLK#. If the situation arises in which, for a prescribed number of clock pulses-three clock pulses in the present exemplary embodiment, the inverted clock signal CLK#has a rising (or else falling) edge and the clock signal CLK does not have a corresponding falling (or else rising) edge, a RESET condition has been satisfied. The decoder circuit interprets the lack of clock pulses in the clock signal CLK as a RESET condition and immediately generates a RESET signal. In this case, the RESET signal has a defined length of, for example, two clock pulses. That means that, immediately after the third clock pulse, that is to say on the rising edge of the fourth clock pulse of the inverted clock signal CLK#, the decoder circuit sets the RESET signal to a high logic level (see arrow) that now comprises the corresponding RESET condition. The RESET signal is then at this high logic level for the duration of two clock pulses and is subsequently set, for example automatically, to a low logic level again, said low logic level denoting the end of the RESET condition.

After the RESET signal has been reset, the DLL circuit is used to restart the clock of the clock signal CLK at the time t4. As an alternative, the clock signal CLK can also be restarted even earlier, for example at the time t3 (where t3>t2). This case is illustrated in figure 1. The latter case is more advantageous since the clock signal CLK can settle even while the RESET signal has a high logic level.

FIG. 2 shows a decoder circuit for obtaining the RESET signal from at least one clock signal.

In FIG. 2, reference symbol 1 is used to designate a decoder circuit. The decoder circuit 1 has two input terminals 2, 3 by means of which a clock signal CLK and a clock signal CLK# that is inverted with respect to the latter can respectively be injected into the decoder circuit 1. Provision is also made of an additional input terminal 4, which can be used to inject an initialization signal PWRON. In the present case, this initialization signal PWRON is a so-called power-on signal. The decoder circuit also has an output 5, at which the reset signal RESET can be tapped off.

The decoder circuit 1 contains a shift register 6 containing three flip-flops 7, 8, 9 which are arranged in series one after the other. A NOR gate 10 is also connected upstream of the shift register 6. The input of the first flip-flop 7 of the shift register 6 is thus connected, via the NOR gate 10, to the input terminal 2 having the clock signal CLK. The outputs of the flip-flops 7, 8 are respectively connected to one input of a downstream flip-flop 8, 9.

The flip-flops 7, 8, 9 of the shift register 6 also have a clock input. The clock inputs of the various flip-flops 7, 8, 9 are connected to the input terminal 3 having the inverted clock signal CLK#. The flip-flops 7, 8, 9 of the shift register 6 finally have a reset input, which is respectively connected to the input terminal 4 having the initialization signal PWRON.

An AND gate 14 is also connected downstream of the shift register 6. The inputs of the AND gate 14 are connected to respective taps 11, 12, 13 and thus to the respective outputs 11, 12, 13 of the flip-flops 7,8, 9. On the output side, this AND gate 11 is connected to the output 5 of the decoder circuit 1.

In addition, the decoder circuit 1 has a further flip-flop 15, which is connected, on the input side, to the output of the AND gate 14. A reset input of the flip-flop 15 is also connected to the input terminal 4 having the initialization signal PWRON. At the output, the flip-flop 15 generates a STOP signal STOP that is injected into the respective other input of the input-side NOR gate 10.

The method of operation of the decoder circuit 1 shall be explained briefly below.

An initialization signal PWRON is injected via the input terminal 4. The initialization signal PWRON constitutes the initialization condition for resetting the flip-flops 7, 8, 9 of the shift register 6. During operation of the decoder circuit 1, that is to say when the flip-flops 7, 8, 9 are initially reset, operation of the decoder circuit 1 is as follows.

The three flip-flops 7, 8, 9 of the shift register 6 are clocked with the inverted clock signal CLK#. The clock signal CLK that is injected, on the input side, into the flip-flop 7 is advanced by one flip-flop 7, 8, 9 for each clock pulse using the clock of the inverted clock signal CLK#. If, after three such shift operations, the outputs 11, 12, 13 of the flip-flops 7, 8, 9 respectively have the same high logic level (HIGH, "1") G0, G1, G2, this means that the clock has respectively been suppressed for three successive clock pulses of the clock signal CLK and the RESET condition has thus been satisfied. These signals G0, G1, G2 are injected into the AND gate 14. If all three signals G0, G1, G2 have an identical value (a high logic level in the present case), the output of the AND gate 14 will also have a high logic level. This signal at the output of the AND gate 14 now forms the RESET signal RESET that is used as the RESET condition in order to reset one or more circuit parts.

This RESET signal RESET is simultaneously injected into the input of an additional flip-flop 15. This additional flip-flop 15, which was initially reset by means of the initialization signal PWRON, generates a STOP signal STOP on the output side, the STOP signal being injected into one input of the NOR gate 10. In this manner, when a RESET signal RESET having a high logic level is present, the input of the shift register 6 is switched to a value that is independent of the clock signal CLK. This makes it possible to ensure that the RESET signal RESET (obtained in this manner) at the output 5 remains stable for a prescribed number of clock pulses of the clock signal CLK#, for example for the duration of two clock pulses.

When the clock signal CLK begins to clock again, the contents of the flip-flops 6, 7, 8 and thus the contents of the shift register and the contents of the additional flip-flop 15 are erased.

Although the present invention has been described above with reference to one preferred exemplary embodiment, it is not restricted thereto but rather may be modified in a variety of ways.

The circuit construction described with reference to FIG. 2 is thus not necessarily required for the decoder circuit according to the invention. Rather, the circuit construction was deliberately illustrated in a very simple manner. The circuit construction can be modified in any desired manner, for example by using more or fewer flip-flops in the shift register depending on the length (which is to be selected) of the latency for detecting a suppressed clock signal. If the intention is to increase the reliability of detecting a suppressed clock signal, it is also possible to select more than three flip-flops in this case. Conversely, fewer than three flip-flops may also be provided for reduced reliability.

In addition, replacing functional units and components with inverted components, for example, makes it possible to specify a multiplicity of different circuit variants without deviating from the fundamental principle of the present invention. Instead of the output-side AND gate, the latter may thus also be in the form of an output-side NAND gate, for example. In this case, the RESET signal would be coded as a lowering of the relevant signal from a high logic level to a low logic level.

In addition, the reset information may also be coded onto the inverted clock signal instead of the clock signal.

LIST OF REFERENCE SYMBOLS

1 Decoder circuit
2, 3, 4 Input terminals
5 Output terminal
6 Shift register
7, 8, 9 Flip-flops
10 NOR gate
11, 12, 13 Taps, outputs of the flip-flops
14 AND gate
15 Additional flip-flop
CLK Clock signal
CLK# Inverted clock signal
G0, G1, G2 Signals
PWRON on Initialization signal
R1 Reset condition
RESET RESET signal
STOP STOP signal
t0-t4 Times

What is claimed is:

1. A method for resetting at least one circuit part of an integrated circuit, comprising:
providing a clock signal and an inverted clock signal, wherein the inverted clock signal is inverted with respect to the clock signal when reset information is not coded onto either of the clock signal and the inverted clock signal, and wherein the clock signal or inverted clock signal, or both, are employed to clock the integrated circuit; and
when a reset condition is present, coding an item of reset information onto the clock signal or the inverted clock signal.

2. The method according to claim 1, wherein the reset information is coded by suppressing the clock of the clock signal or of the inverted clock signal for a prescribed first duration.

3. The method according to claim 2, wherein the prescribed first duration corresponds at least to a duration of two clock pulses of the clock signal or of the inverted clock signal.

4. The method according to claim 2, wherein the reset information in the clock signal or in the inverted clock signal is locally extracted by a decoder circuit within the integrated circuit by determining the prescribed first duration.

5. The method according to claim 2, wherein the reset information is coded onto the clock signal, and wherein the prescribed first duration is determined by counting the clock pulses of the inverted clock signal in which the clock pulses have not been suppressed.

6. The method according to claim 2, wherein when the prescribed first duration is exceeded, a decoder circuit within the integrated circuit generates a local reset signal that is used to reset the at least one circuit part.

7. The method according to claim 6, wherein the local reset signal is generated by changing a signal amplitude from a first logic level to a second logic level for a prescribed second duration.

8. The method according to claim 7, wherein the prescribed second duration corresponds at least to the duration of one clock pulse of the clock signal or of the inverted clock signal.

9. The method according to claim 7, wherein, after the prescribed first duration, the clock signal in which the clock was suppressed begins to clock again at a time that is within the prescribed second duration or is after the prescribed second duration.

10. A circuit arrangement, comprising:
a first clock input configured to receive a clock signal;
a second clock input, configured to receive an inverted clock signal, wherein the inverted clock signal is inverted with respect to the clock signal when either of the clock signal and inverted clock signal are not suppressed;
a clock suppression device, when a reset condition is present, is configured to suppress the clock signal or the inverted clock signal for a prescribed first duration to provide an item of reset information;
a decoder circuit, which is configured to extract the reset information from the clock signal or from the inverted clock signal, measures the duration within which the clock of the clock signal or the inverted clock signal is suppressed and generates a reset signal if the duration measured exceeds the prescribed first duration; and
an output terminal to output the reset signal that has been generated.

11. The circuit arrangement according to claim 10, wherein the decoder circuit has a counter for counting the clock pulses of the clock signal or of the inverted clock signal.

12. The circuit arrangement according to claim 10, wherein the decoder circuit has a shift register, which is triggered by the clock of the clock signal whose clock has not been suppressed, the shift register having a first number of flip-flops, and the first number corresponding to the number of clock pulses of the clock signal or of the inverted clock signal which together are needed at least to determine the prescribed first duration.

13. The circuit arrangement according to claim 10, further comprising a maintenance circuit, which, when the reset signal is present, maintains the reset signal for a prescribed second duration.

14. The circuit arrangement according to claim 13, wherein the maintenance circuit is in the form of a flip-flop.

* * * * *

UNITED STATES PATENT AND TRADEMARK OFFICE
CERTIFICATE OF CORRECTION

PATENT NO.         : 7,363,561 B2
APPLICATION NO.    : 11/117736
DATED              : April 22, 2008
INVENTOR(S)        : Stefan Dietrich et al.

Page 1 of 1

It is certified that error appears in the above-identified patent and that said Letters Patent is hereby corrected as shown below:

Please remove the whole paragraph found in Column 4, lines 23 through 32

> In FIG. 1, CLK is used to designate the clock signal and CLK#is used to designate the clock signal that is inverted with respect to the clock signal. These clock signals CLK, CLK#can be generated, for example, by a DLL (Delay Locked Loop) circuit. The clock signals CLK, CLK#have trapezoidal clock pulses and pulse intervals. A RESET signal is also provided. The RESET signal includes an item of RESET information that is derived, according to the invention, from the two clock signals CLK, CLK#, as will also be described in detail below.

The following paragraph was omitted by the USPTO from the subject application. Please add the following paragraph to Column 4 line 12:

--Figure 1 uses a signal/time graph to illustrate the manner in which an item of RESET information is obtained (according to the invention) from a clock signal.--

Signed and Sealed this

Eighth Day of July, 2008

JON W. DUDAS
*Director of the United States Patent and Trademark Office*